(12) United States Patent
Kindt

(10) Patent No.: US 6,753,585 B1
(45) Date of Patent: Jun. 22, 2004

(54) VERTICAL COLOR PHOTO-DETECTOR WITH INCREASED SENSITIVITY AND COMPATIBLE VIDEO INTERFACE

(75) Inventor: Willem Johannes Kindt, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/313,674

(22) Filed: Dec. 5, 2002

(51) Int. Cl.[7] .............................................. H01L 27/14
(52) U.S. Cl. ...................................... 257/440; 257/431
(58) Field of Search ................................ 257/431, 439, 257/440, 432, 433, 434, 435, 436, 437, 438, 441, 442, 443, 444, 445, 446, 447, 448, 449, 450, 451, 452, 458, 459, 460, 461, 462, 463, 464, 465, 466

(56) References Cited

U.S. PATENT DOCUMENTS 3,971,065 A   7/1976  Bayer ........................... 358/41
6,646,682 B1 * 11/2003  Hou
2002/0058353 A1 * 5/2002  Merrill

* cited by examiner

*Primary Examiner*—Nathan J. Flynn
*Assistant Examiner*—Kevin Quinto
(74) *Attorney, Agent, or Firm*—Brett A. Hertzberg; Merchant & Gould

(57) ABSTRACT

An improved vertical photo-detector cell is used in an imaging sensor. Sensor material associated with a given color in a vertical photo-detector cell is coupled to sensor material associated with the same color in an adjacent photo-detector cell such that photo-carriers from adjacent cells are combined. The coupled sensor materials result in an increased size sensor area for the given color. The increased sensor area associated with each pixel in the sensor results in increased sensitivity and improved fill factor for each color. In an imaging sensor array, the vertical photo-detector cells are arranged such that each color plane is arranged in a pattern. Each sensor in a pattern has a central portion and an extending portion. The central portion and the extending portion are each located about a geometrical center that is associated with a pixel in the array.

20 Claims, 6 Drawing Sheets

VERTICAL COLOR PHOTO-DETECTOR WITH INCREASED SENSITIVITY AND COMPATIBLE VIDEO INTERFACE

FIELD OF THE INVENTION

The present invention relates generally to pixel array technology. More particularly, the present invention relates to vertical photo-detectors that include enhanced color sensitivity and a video interface that is compatible with conventional video systems.

BACKGROUND OF THE INVENTION

Imaging sensors are commonly used in various applications such as digital cameras. The imaging sensor includes multiple pixel sensors that are arranged in an array. Light is reflected from a scene and received by the imaging sensor. The imaging sensor provides signal outputs that have magnitudes that correspond to the light intensity level for each pixel sensor within the array.

Conventional color imaging sensors include three sensor elements that are arranged as a cell within the array. Each cell thus includes a first sensor element that provides a red signal, a second sensor element that provides a green signal, and a third sensor element that provides a blue signal. Each of the sensor elements includes a color filter that is located above the surface of the device. For example, a red filter is placed above the first sensor element, a green filter is placed above the second sensor element, and a blue filter is placed above the third sensor element. The filters mask other colors so that the signal from each of the sensor elements corresponds to the detected color signals from the imaging sensor.

SUMMARY OF THE INVENTION

An improved vertical photo-detector cell has increased sensitivity when compared to a conventional photo-detector cell. The improved vertical photo-detector cell is configured to collect photo-carriers from adjacent improved vertical photo-detector cells to increase the effective area of the sensor region associated with each color.

According to an example of the present invention, a pixel cell for an imaging sensor includes a first and second improved vertical photo-detector cell. The first improved vertical photo-detector cell is located about a first location in the imaging sensor. The second improved vertical photo-detector cell is located about a second location in the imaging sensor. The second location is adjacent to the first location. A first photo-detector region is located in the first and second improved vertical photo-detector cells, and is arranged to detect light that substantially corresponds to a first color. The first photo-detector region has a first geometric center at the first location. A second photo-detector region is located in the second improved vertical photo-detector cell, and is arranged to detect light that substantially corresponds to a second color. The second photo-detector region has a second geometric center at the second location.

According to a further aspect of the present invention, the first color may correspond to one of red, green, and blue, and the second color may correspond to another of red, green, and blue.

According to another aspect of the present invention, the first photo-detector region is located in a first plane and the second photo-detector region is located in a second plane that is different from the first plane. The first plane in the photo-detector region is non-intersecting with respect to the second photo-detector region. According to one example, the first plane may be located above the second plane such that the first photo-detector region is closer to a surface of the imaging sensor. The first photo-detector region may be arranged to supply a signal via an electrical contact that extends from the first photo-detector region to the surface of the imaging sensor. According to another example, the first plane is located below the second plane such that the second photo-detector region is closer to a surface of the imaging sensor. The first photo-detector region may be arranged to supply a signal via an electrical contact that extends from the first photo-detector region to the surface of the imaging sensor without contacting the second photo-detector region.

In another example of the present invention, a third improved vertical photo-detector cell is located at a third location in the imaging sensor. The third location is adjacent to the first and second locations. A third photo-detector region is located in the third improved vertical photo-detector cell. The third photo-detector region is arranged to detect light that substantially corresponds to a third color. The third photo-detector region has a third geometric center at the third location. The pixel cell may also include a fourth improved vertical photo-detector cell that is located at a fourth location in the imaging sensor. The fourth location is adjacent to the first, second, and third locations. A fourth photo-detector region that is located in the fourth improved vertical photo-detector cell. The third photo-detector region is arranged to detect light that substantially corresponds to the third color. The fourth photo-detector region has a fourth geometric center at the fourth location. The first, second, third, and fourth improved vertical photo-detector cells may be arranged as a group that defines a sensor cell.

In yet another example of the present invention, an imaging sensor is arranged as an array of pixel cells. The imaging sensor includes a first, second, third, and fourth sensor. The first sensor is sensitive to light that approximately corresponds to a first wavelength. The first sensor is centered about a first pixel location in the array. The second sensor is sensitive to light that approximately corresponds a second wavelength. The second sensor is centered about a second pixel location in the array. The third sensor is sensitive to light that approximately corresponds a third wavelength. The third sensor is centered about a third pixel location in the array. The fourth sensor that is sensitive to light that approximately corresponds the third wavelength. The fourth sensor is centered about a fourth pixel location in the array. A sensor material is associated with a selected one of the first, second, third, and fourth sensors. The sensor material includes a central portion and an extending portion. The central portion is located within an improved vertical photo-detector cell. The extending portion is located within another improved vertical photo-detector cell that is adjacent to the improved photo-detector cell. The central portion is coupled to the extending portion such that photo-carriers are collected from the adjacent improved vertical photo-detector cell to increase sensitivity of the selected sensor.

According to a further aspect of the present invention, the array of pixel cells includes a set of first, second, third, and fourth alternating patterns. The first alternating pattern of first and third sensors extends from a pixel cell along a first direction. The second alternating pattern of first and fourth sensors extends from the pixel cell along a second direction. The third alternating pattern of second and third sensors extends from the pixel cell along the first direction. The fourth alternating pattern of second and fourth sensors extends from the pixel cell along the second direction.

According to yet a further aspect of the present invention, the selected one of the sensors is configured in a shaped pattern that is defined by the central and extending portions of the sensor material. The shaped pattern may correspond to a quadrilateral that is substantially centered about a pixel in the array. The shaped pattern may be oriented at angle of forty-five degrees about a pixel in the array. The shaped pattern may provide a resulting sensor that has a fill-factor of approximately 100% for a color associated with the first wavelength. The shaped pattern may have extending portions of sensor material that extend along an orthogonal set of axis with respect to the center of sensor material. The sensor material associated with selected one of the sensors may have an effective area that is substantially three times the area associated with a pixel in the array.

According to still a further aspect of the present invention, a group of sensors may outline a central region that includes a fifth sensor that is sensitive to light that approximately corresponds to the second wavelength. The fifth sensor is configured to drain photo-carriers that are induced by second wavelength related light that is incident on the central region.

In still another example, an imaging sensor includes a first, second, and third means for collecting photo-carriers. The first means for collecting photo-carriers is configured to collect first photo-carriers from a first improved vertical photo-detector cell. The first photo-carriers are associated with a first color. The second means for collecting photo-carriers is configured to collect second photo-carriers from a second improved vertical photo-detector cell that is located adjacent the first improved vertical photo-detector cell. The second photo-carriers are associated with a second color. The third means for collecting photo-carriers is configured to collect first photo-carriers from the second improved vertical photo-detector cell. A means for coupling is configured to couple the first photo-carriers that are collected from the second means for collecting photo-carriers to the first photo-carriers that are collected from the first means for collecting photo-carriers such that photo-carriers that are associated with the first color from the improved vertical photo-detector cell and the adjacent improved vertical photo-detector cell are combined to increase sensitivity to the first color in the sensor.

A more complete appreciation of the present invention and its improvements can be obtained by reference to the accompanying drawings, which are briefly summarized below, the following detail description of presently preferred embodiments of the invention, and the appended claims.

DETAILED DESCRIPTION OF THE PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more massive or active intermediary devices. The term "circuit" means either a single component or a multiplicity of components, either active or passive, that are coupled together to provide a desired function.

Conventional digital video processors (DVPs) are arranged to process the color readout lines by selectively reading one of the red, green, and blue color signals at different times. In other words, a single color associated with a pixel in the sensor array is processed at a time. According to the present invention, the improved pixel sensor array includes an interface that is compatible with a conventional DVP. The improved pixel sensor array includes improved vertical photo-detector cells that are addressed as pixels in the pixel sensor array. Each improved photo-detector cell has an improved sensitivity and fill factor when compared to conventional photo-detector cells. Also, adverse aliasing effects are reduced in each improved photo-detector cell, as will be described later.

The present invention is related to an improved vertical photo-detector cell that is used in an imaging sensor. Sensor material associated with a given color in an improved vertical photo-detector cell is coupled to sensor material associated with the same color in an adjacent improved photo-detector cell such that photo-carriers from adjacent cells are combined. The coupled sensor materials result in an increased size sensor area for the given color. The increased sensor area associated with each pixel in the sensor results in increased sensitivity and improved fill factor for each color. In an imaging sensor array, the improved vertical photo-detector cells are arranged such that each color plane is arranged in a pattern. Each sensor in a pattern has a central portion and an extending portion. The central portion and the extending portion are each located about a geometrical center that is associated with a pixel in the array.

Figure 1:
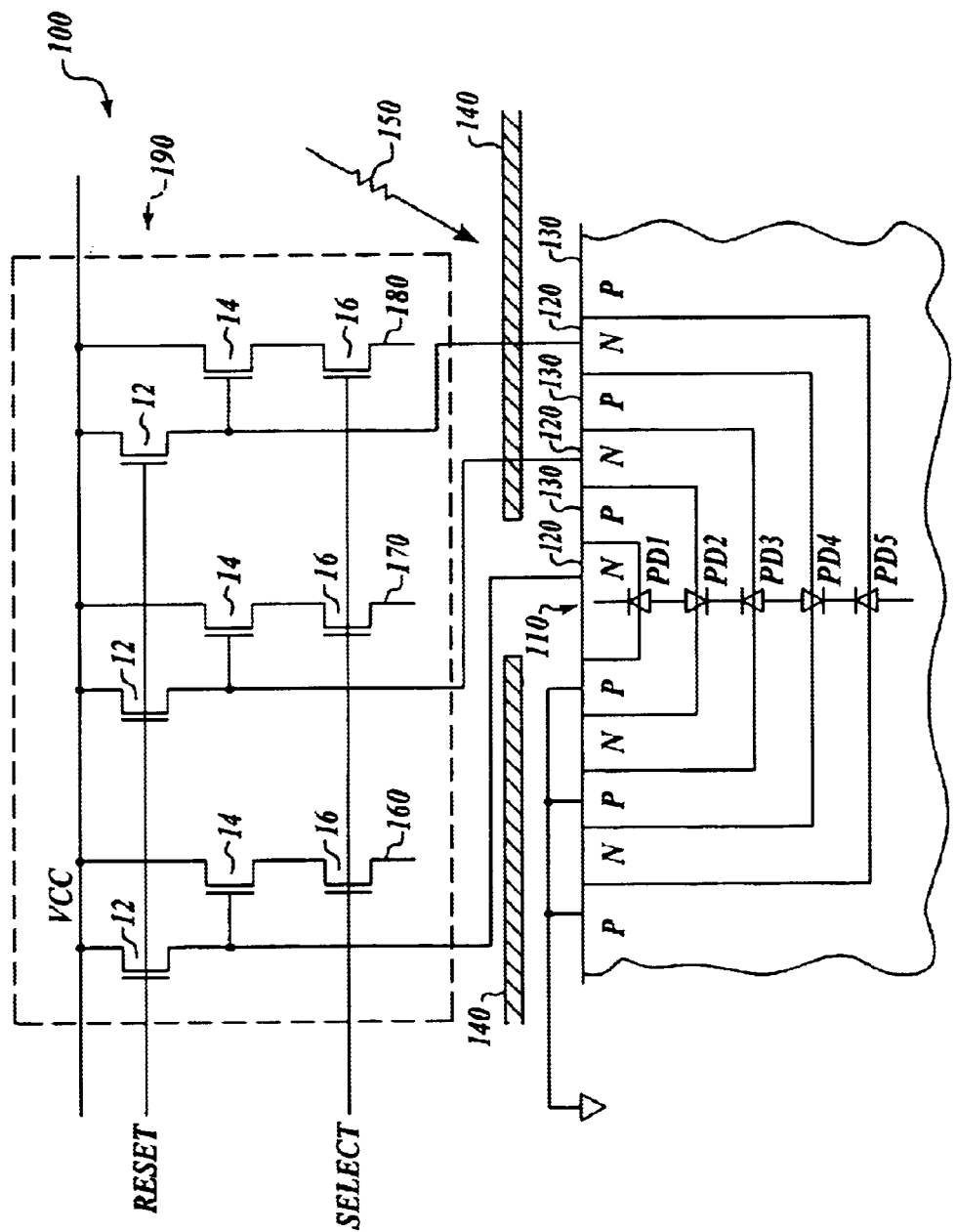
FIG. 1 is an example cross-sectional view of an improved photo-detector.

FIG. 1 is an example cross-sectional view of an improved vertical photo-detector that may be employed by the present invention. The improved vertical photo-detector cell includes n-type material in regions 120 and p-type material in regions 130. Photodiodes are formed at the boundary of the n-type materials (120) and the p-type materials (130) as illustrated by PD1–PD5.

In operation, each of the p-type material regions is coupled to a circuit ground, while each of the n-type material regions is coupled to other circuitry (190). The photo-detector receives light (150) on a central portion of surface 110, while a light shield (140) is arranged to occlude other portions of the surface (110). Each of the photodiodes is sensitive to light. The energy associated with light is absorbed into the silicon material such that photocurrents flow in photodiodes (PD1–PD5) in an amount that is proportional to the intensity level of light received by each particular photodiode. Each photodiode is located at a depth in the semiconductor material that corresponds to a particular wavelength of light. For example, photodiode PD1 is sensitive to light that is in the wavelength of blue light, photodiodes PD2 and PD3 are sensitive to light that is in the wavelength of green light, and photodiodes PD4 and PD5 are sensitive to light that is in the wavelength of red light.

Circuitry 190 includes three sets of transistors, where each set includes transistors 12, 14, and 16. The circuitry (190) operates over three phases of operation. The first phase of operation is the reset phase, where voltages at various nodes are initialized. The second phase of operation is the integration phase, where light is impinged upon the surface of the improved photo-detector cell such that a photocurrent is integrated over an exposure time interval. The third phase of operation is the readout phase, where the signal levels from the integration phase are provided to other circuitry for processing (e.g., a DVP). Readout lines 160, 170 and 180 correspond readout lines for the read, green, and blue intensity levels associated with the sensor. The operation of circuitry 190 will be described in more detail below with respect to a single photodiode.

Figure 2:
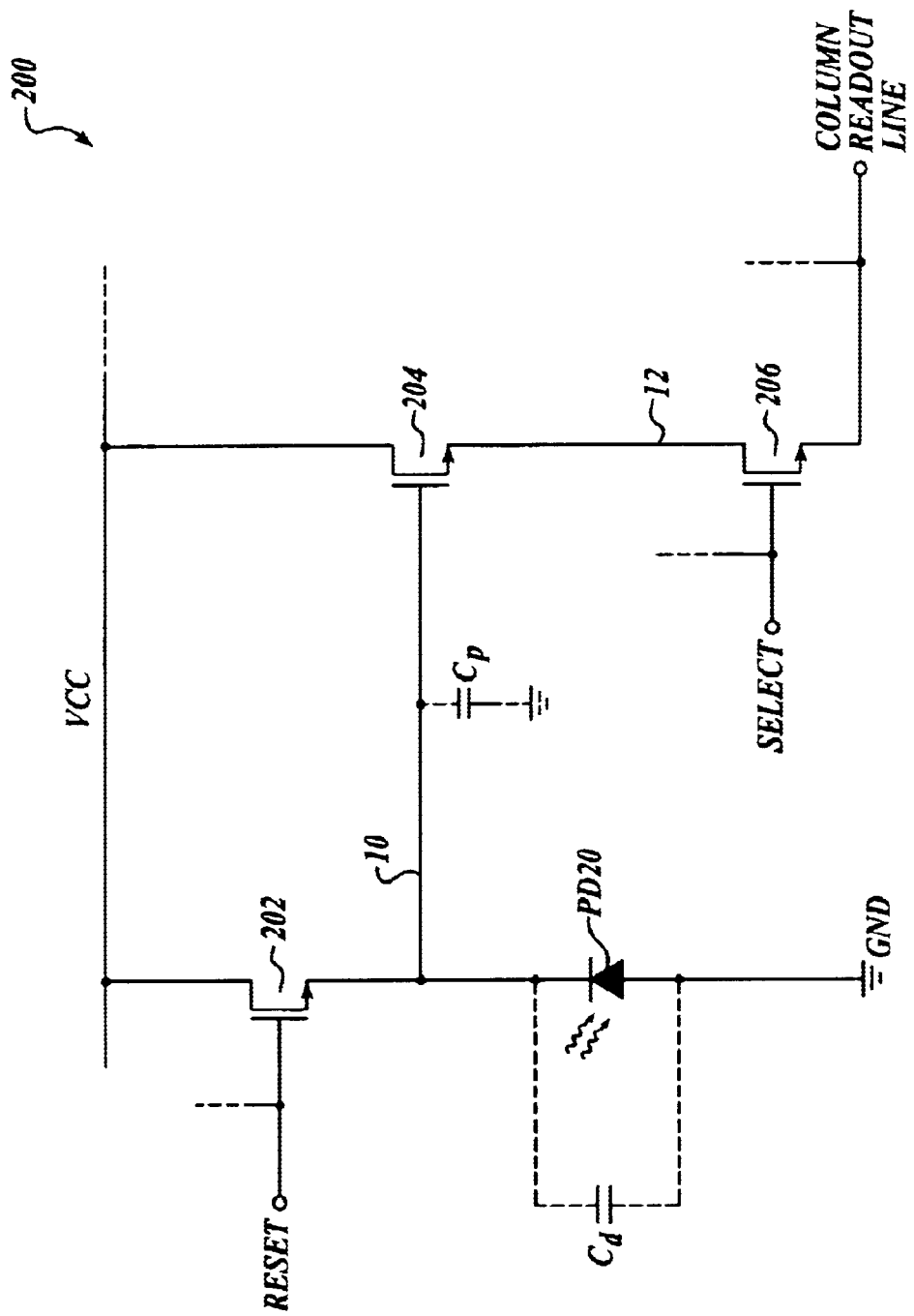
FIG. 2 is a schematic diagram of an example pixel cell from a pixel array.

FIG. 2 is a schematic diagram of an example pixel cell (200) from a pixel array that is arranged in accordance with the present invention. The pixel cell includes three transistors and will be hereinafter referred to as a 3-T pixel cell. The 3-T pixel cell includes a photodiode (PD20), and three NMOS transistors (202, 204, 206).

Transistor 202 has a gate that is coupled to a RESET signal, a drain that is coupled to a high power supply (VCC), and a source that is coupled to the photodiode at node 10. The photodiode has a cathode that is coupled to node 10 and an anode that is coupled to a low power supply (GND). Transistor 204 has a gate that is coupled to node 10, a source that is coupled to node 12, and a drain that is coupled to the high power supply (VCC). Transistor 206 has a gate that is coupled to a SELECT signal, a source that is coupled to a column readout line, and a drain that is coupled to node 12. Transistor 202 is arranged to reset the pixel cell when activated by the RESET signal. Transistor 204 operates as a source follower that buffers the voltage from node 10. Transistor 206 is arranged to couple the output of the source follower (transistor 204) to the column readout line when activated by the SELECT signal.

The general operation of the 3-T pixel cell is as follows. A positive pulse is applied to the gate of transistor 202 so that a positive bias voltage is applied at the cathode of photodiode PD20. The photodiode has an inherent depletion layer capacitance (Cd) that charges up while power is applied to the photodiode. After transistor 202 turns off, the photodiode PD20 remains biased at the positive bias voltage because of the charge that is stored in its depletion layer capacitance (Cd). A photocurrent (Ip) will flow from the cathode to the anode of the photodiode when the photodiode receives photons (light). The photocurrent (Ip) discharges the photodiode's depletion layer capacitance (Cd) and causes the voltage across photodiode PD20 to drop.

Stray and parasitic capacitances (Cp) are present on node 10 in pixel cell 200. The stray and parasitic capacitance (Cp) is substantially determined by the parasitic capacitance from the gate of transistor 204 (the source follower) and the parasitic capacitance from the source of transistor 202 (the reset transistor). The bias voltage that is initially applied to the photodiode is stored on the combination of capacitors Cp and Cd.

The photocurrent (Ip) is integrated on the depletion layer capacitance (Cd) along with the parasitic capacitance (Cp) during an integration time (Ti). The total charge that is integrated on the capacitance is determined by Ip*Ti. At the end of the integration interval, the output voltage (Vd) of the photodiode is decreased by an amount (Vs) that is determined by Vs=Ip*Ti/(Cd+Cp). Thus, the output voltage (Vd) of the photodiode is determined by Vd=Vi-Vs, where Vi is the initial voltage that is stored on capacitor Cd prior to applying light to the photodiode. Vs is described as the signal voltage, since it is related to the intensity of received light (Ip) and the length of the exposure time (Ti).

The output voltage (Vd) is applied to the gate of the transistor 204, which operates a source follower, such that the signal at node 12 corresponds to (Vd-Vt), where Vt is the threshold voltage of transistor 204. A positive pulse is applied to the gate of transistor 206 (the SELECT transistor) via the SELECT signal such that the readout voltage (Vd-Vt) is coupled to the column readout line at the source of transistor 206. The column readout line receives a readout voltage that is related to the output voltage (Vd) of the photodiode by an offset voltage. The offset voltage corresponds to the threshold voltage (Vt) of transistor 204.

Improved Vertical Photo-Detector Cell

The improved vertical Photo-detector cells are located adjacent to neighboring vertical photo-detector cells. Each pixel grouping in a sensor array comprises three types of improved vertical photo-detector cells, one for each color (e.g., RGB). An improved vertical photo-detector cell is arranged to provide only one color signal (e.g., red), while a neighboring photo-detector cell is arranged to provide only one other color signal (e.g., green).

Figure 3:
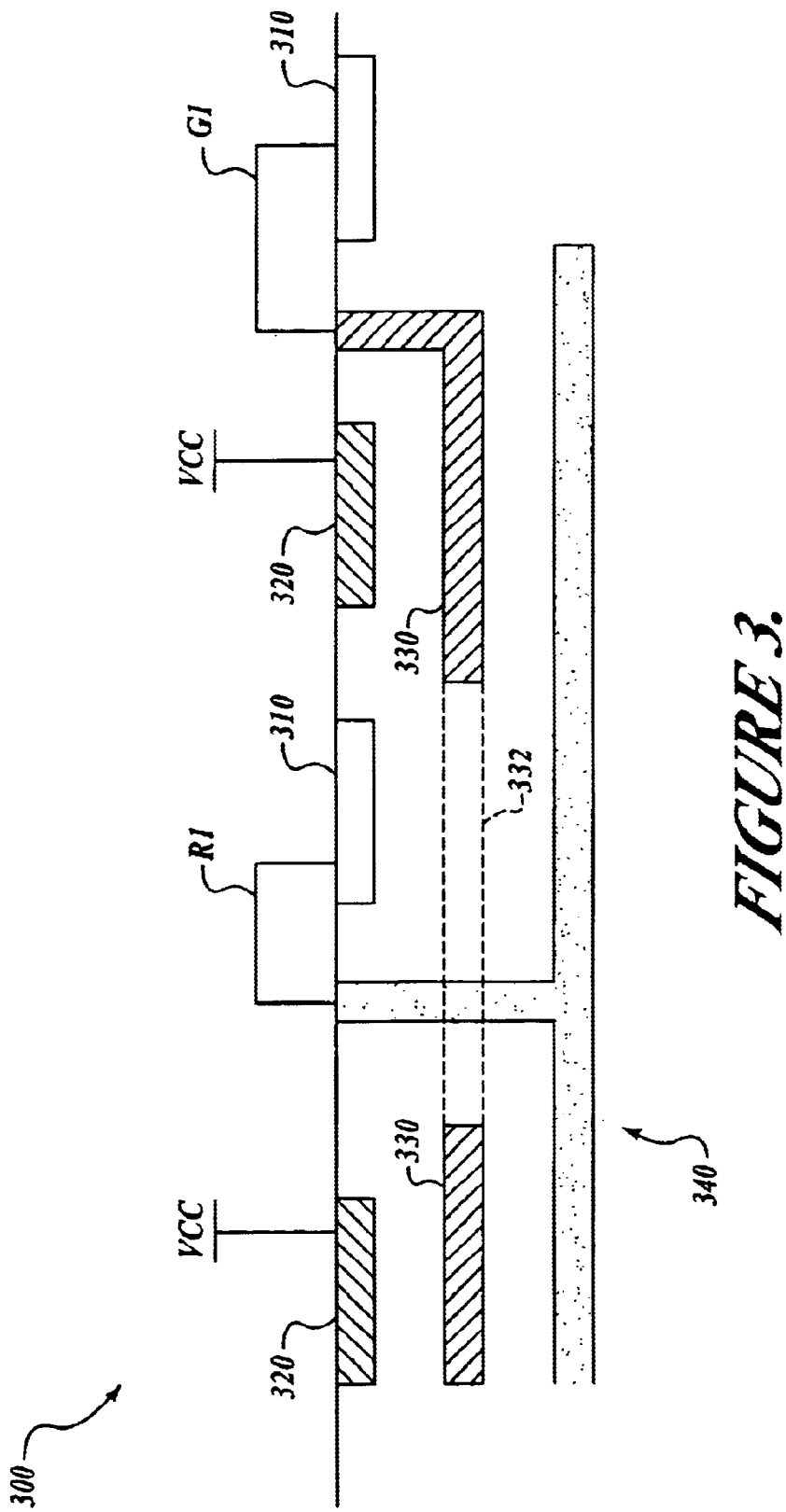
FIG. 3 is a partial cross-sectional view of an improved vertical photo-detector cell.

Photocurrents occur in each photo-detector cell as a result of incident light being received by the corresponding photodiode. One-third of the incident light on the improved vertical photo-detector cell is used for the intant pixel (corresponding to one of the colors), while two-thirds of the incident light is unrelated to the instant pixel cell (the other two colors). The sensitivity to the designated color in each improved vertical photo-detector cell is improved by using the photocurrents for the designated color from neighboring pixels. The improved vertical photo-detector cell is described below with reference to FIG. 3. The improved photo-detector cell illustrated in FIG. 3 shows two neighboring pixels from a pixel grouping (e.g., see FIG. 4). Each pixel includes an improved vertical photo-detector cell that has a blue sensitive region (320), a green sensitive region (330), a red sensitive region (340), and electronics (310) that are arranged to process the signals from the improved vertical photo-detector. In one example, the red and green sensitive photodiodes are realized using buried implantations. The buried photodiodes are contacted using implanted "plugs" that permit access to the photodiodes from the surface of the device. The blue device is implanted in the surface of the silicon. The photodiodes are arranged to collect photo-carriers that are generated by the incident light according to the corresponding color.

The pixel on the left half of FIG. 3 is arranged to process the red signals (R1), while the pixel on the right half of FIG. 3 is arranged to process the green signals (G1). The red sensitive photodiode on the right hand side of the figure is tied together with the red sensitive photodiode on the left hand side of the figure. The electronic circuit (310) for the red pixel detects the red photons that are collected by the green pixel (the right side). Similarly, the green sensitive photodiode on the left hand sides of the figure is tied together with the green sensitive photodiode on the right hand side of the figure. The electronic circuit (310) for the green pixel detects the green photons that are collected by the red pixel (the left side). Fill factor and sensitivity for each color is improved in the resulting image sensor by collecting the photons from the neighboring pixels.

Each photodiode area that is shown in FIG. 3 is a simplified diagram including fill codes (e.g., a hash pattern for blue) to illustrate the different photodiode regions. However, each shaded region is actually a junction is defined by p-type and n-type semiconductor materials (e.g., see FIG. 1). In one example, the filled regions are represented as n-type material that is implanted in the defined region, where p-type material separates each n-type material region. For this example, an n-type contact plug extends from the surface of the device to the contacted buried region.

The green photodiode area illustrated in FIG. 3 cannot cross the contact plug for the red photodiode as is illustrated by the dotted area (332). The connections between the green photodiode materials from adjacent vertical cells are made in three-dimensional space as will be described later. Similarly, the connections between the blue photodiode materials from adjacent vertical cells cannot cross the contact plugs for the green and red photodiodes (not shown).

Pixel Sensor Array Organization

Figure 4:
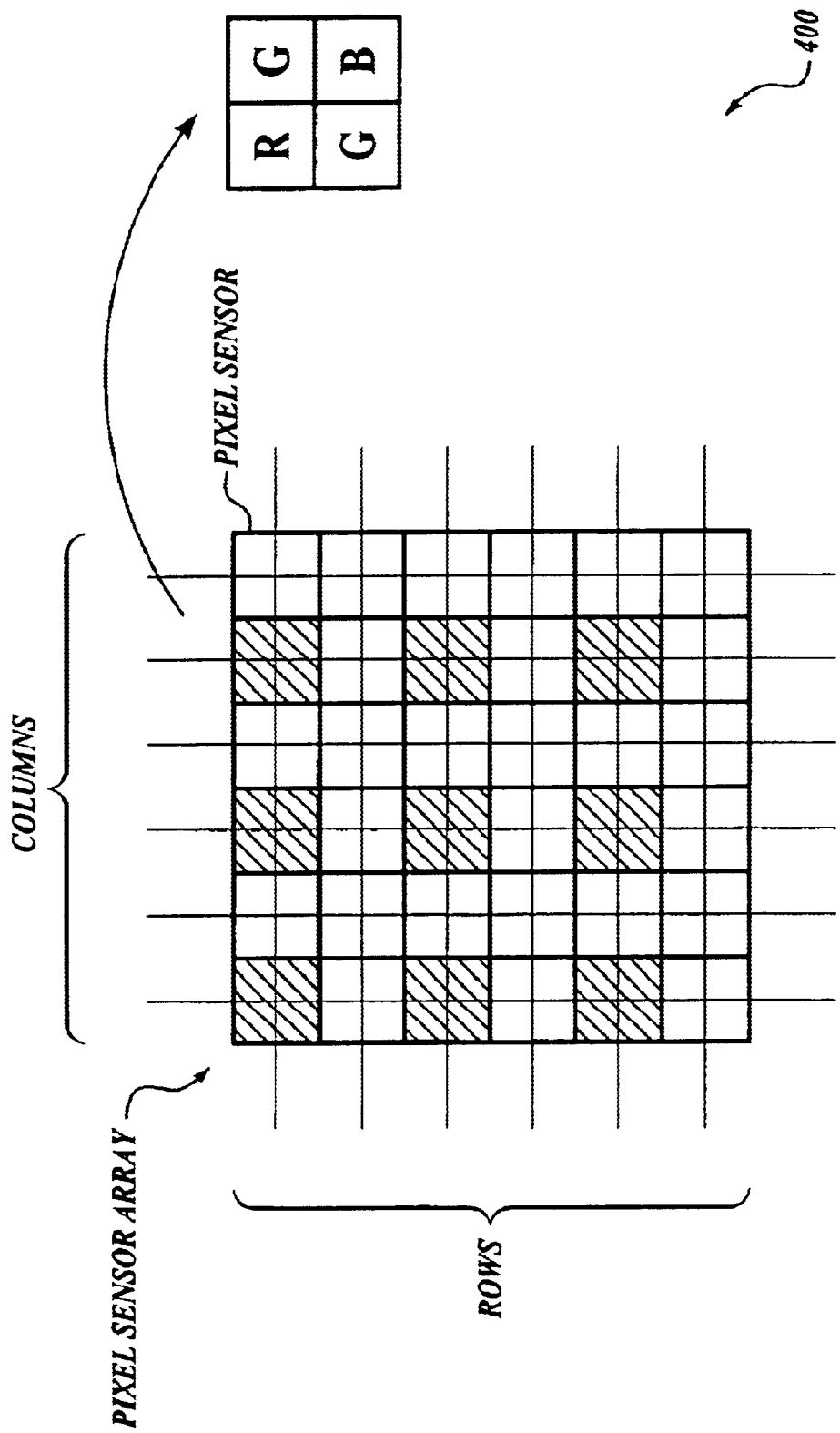
FIG. 4 is an illustration of an example pixel sensor pattern.

A pixel sensor array is illustrated in FIG. 4. The pixel sensor array is organized as a number of rows and columns.

The pixel sensor array is arranged so that every other vertical photo-detector cell senses the same color. For example, looking at the first row, the sensors are arranged as a repeated pattern of red (R) sensors followed by green (G) sensors. Looking at the first column, the sensors are arranged as a repeated pattern of red (R) sensors followed by green (G) sensors. Looking at the second column, the sensors are arranged as a repeated pattern of green (G) sensors followed by blue (B) sensors.

Since three colors are processed for each sensor cell, each grouping of four pixels defines a central common location on an x-y coordinate grid. Each grouping of four vertical photo-detector cells includes a red (R) sensor, two green (G) sensors, and a blue (B) sensor as illustrated in FIGURE The quad grouping (RGGB) arrangement illustrated in FIG. 4 is commonly referred to as a "Bayer pattern". Unlike the present invention, color filters are employed in a conventional Bayer pattern sensor array. Conventional DVPs are available to readily process information from a pixel sensor array that is arranged in the Bayer pattern.

A quad grouping (RGGB) of the sensors are located about a common location in the sensor array for FIG. 4. With color filter technology, red light that is received in the regions occupied by the blue and green sensors is ignored so only one fourth of the total area of the quad grouping (25%) detects red light at the pixel location. Also, green light that is received in the regions occupied by the blue and red sensors is ignored so only two fourths of the total area of the quad grouping (50%) detects green light at the pixel location. Similarly, blue light that is received in the regions occupied by the green and red sensors is ignored so only one fourth of the total area of the quad grouping (25%) detects blue light at the pixel location. Fill factor is a measure of sensitivity for the sensor at a particular pixel location. The fill factor for the pixel location shown in FIG. 4 has a red fill factor of 25%, blue fill factor of 25%, and a green fill factor of 50%.

Figure 5:
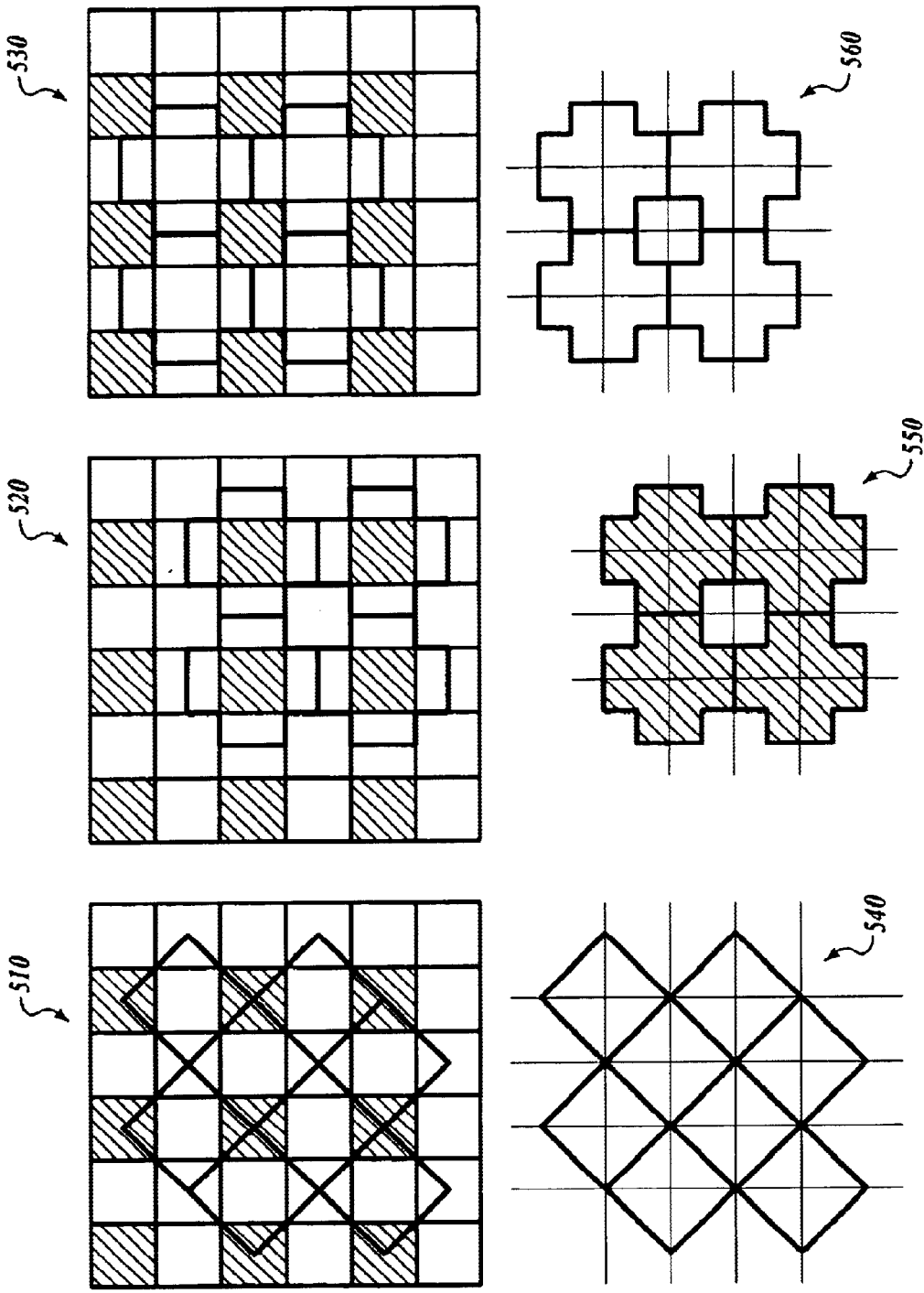
FIG. 5 is an illustration of example pixel sensor patterns with increased areas.
Figure 6:
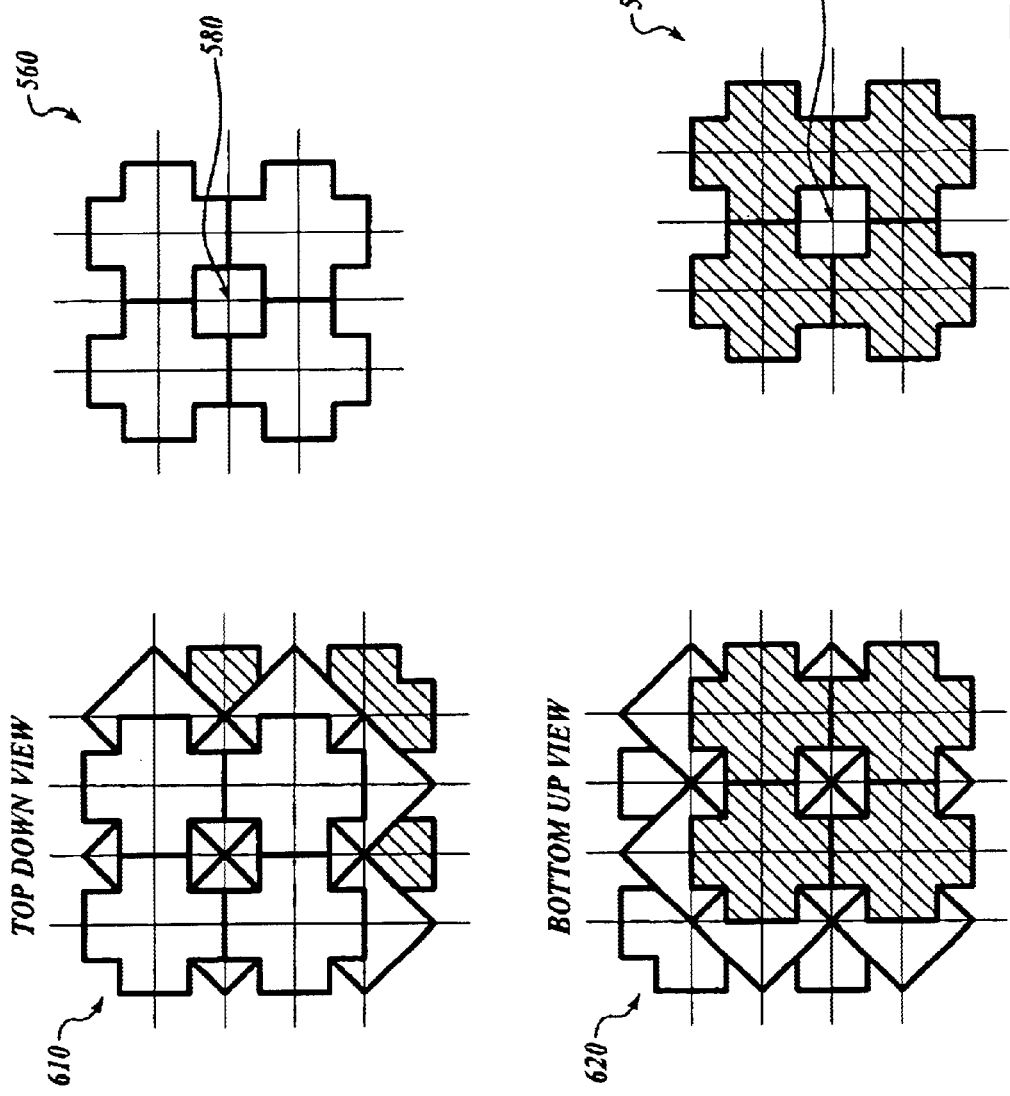
FIG. 6 is another illustration of example pixel sensor patterns with increased areas, in accordance with the present invention.

The pattern employed in FIG. 4 is modified in an improved vertical photo-detector cell by reclaiming unused photocurrents from the neighboring vertical photo-detector cell. The area of each color sensor is increased by a factor of two as shown in FIGS. 5 and 6. Each pixel in the improved array is a color sensor that corresponds to an improved vertical photo-detector cell such as that illustrated in FIGS. 1 through 3.

Example Pixel Sensor Array Patterns for Improved Performance

FIG. 5 is an illustration of example pixel sensor patterns that may be employed to increase the area of each color sensor form FIG. 4. The figure includes three pixel sensor arrays (510–530), each with a pattern (540–560) or template superimposed over the pixel area of interest.

Array 510 shows the pixel sensor array from FIG. 4 with an increased size template for the green sensors superimposed over the array. The green sensors have an increased area as illustrated by sensor area 540. Each of the bounded regions in sensor area 540 corresponds to the n-type material in the green sensor (see FIG. 2). The black solid line in pattern 540 shows the boundary between each green sensor, and represents a gap in the green sensor material. The crossed grid lines in pattern 540 designate the center location for each green pixel sensor, which corresponds to a substantially similar center location as the green pixel sensors from FIG. 4. Pattern 540 is observed as a set of square regions that are rotated about a 45° angle with respect to the center of the green pixel sensor.

Arrays 520 and 530 show the pixel sensor array from FIG. 4 with an increased size template for the red and blue sensors, respectively. The templates for the sensor areas are superimposed over the array. The red sensors have an increased area as illustrated by sensor area 550. The blue sensors have an increased area as illustrated by sensor area 560. Each of the bounded regions in sensor areas 550 and 560 correspond to the n-type material in the red and blue sensors (see FIG. 2). The black solid line in patterns 550 and 560 show the boundary between each red or blue sensor, and represents a gap in the sensor material. The crossed grid lines in patterns 550 and 560 designate the center locations for each red or blue pixel sensor, which corresponds to a substantially similar center location as the pixel sensors from FIG. 4. Patterns 550 and 560 are observed as a cross-type pattern that includes a central portion and an extending portion. The central portion is located about the center of the pixel sensor. The extending portion extends outward from the central portion. For the example illustrated in FIG. 5, the extending portion extends longitudinally outward in an orthogonal orientation orthogonally (e.g., along the x and y axis) from a central square region in a manner similar to a plus symbol.

Although pattern 540 is shown as square regions, other patterns may also provide satisfactory performance. For example, circular, elliptical, rectangular, and other polygon regions may be employed for the green sensor. In one example, pattern 540 is arranged as a series of hexagonal shaped patterns. For all combinations of patterns, the area can be optimized for fill factor and color balance.

The increased areas for each of the sensors can be adjusted to provide color balancing in the imaging sensor. In one example, the green sensors have an increased area that is approximately twice the sensor area of a conventional green sensor in a Bayer pattern. The increased green sensor area provides improved sensitivity with an improved fill factor (e.g., 100% fill factor instead of 50% as found in green sensors for a conventional Bayer pattern). In another example, the red and/or blue sensors have an increased area that is approximately three times the sensor area of a conventional red or blue sensor in a Bayer pattern. The increased red sensor area provides improved sensitivity with an improved fill factor (e.g., 75% fill factor instead of 25% as found in red and blues sensors for a conventional Bayer pattern). The fill factor and sensitivity can be adjusted by employing different shaped/sized patterns as may be desired.

FIG. 6 illustrates the positioning of patterns 540 through 560 in an example array. A top down view is illustrated as view 610, while a bottom up view is illustrated as view 620. Each view includes grid lines to illustrate an x-y coordinate system for the resulting pixel array. The views illustrate a three-dimensional depth and positioning of the sensors in a semiconductor, where each layer represents a different depth in the material.

The blue sensors are located at the highest plane (nearest the surface of the page) illustrated in the top down view (610), while the red sensors are located at the lowest plane. The blue sensors do not have a 100% fill factor for pattern 560, and have an empty space at location 580. In one example, the empty space can include a photodiode that is configured to drain blue light induced photo-carriers that are incident on location 580. The example photo-diode at location 580 prevents photodiodes that are incident on location 580 from diffusing into the sensor regions outlined by pattern 560. Diffused photo-carriers can create a false spot in the image.

The red sensors are located at the highest plane (nearest the surface of the page) illustrated in the bottom up view (620), while the blue sensors are located at the lowest plane. The red sensors do not have a 100% fill factor for pattern 570, and have an empty space at location 580. In one example, the empty space can include a photo-diode that is configured to drain red light induced photo-carriers that are incident on location 580. The example photo-diode at location 580 is configured to prevent photodiodes that are incident on location 580 from diffusing into the sensor regions outlined by pattern 570.

Observations

The improved vertical photo-detector cells are organized in an array along an x-y coordinate system as illustrated by the grid lines in the figures. The central location of each detector in the resulting array is substantially the same as that for a conventional sensor array. By maintaining the same central location for each sensor in the array, conventional imaging algorithms (e.g., color interpolation) may be performed on the resulting image data.

The sensitivity of the improved vertical photo-detectors is greater than that for a conventional sensor array since additional photo-carriers from an adjacent cell are included in the overall sensor area for each color in the improved photo-detector cell. In one example, the sensor area for a color in the improved vertical photo-detector cell is increased by a factor of two. In another example, the sensor area for a color of the improved vertical photo-detector cell is increased by a factor of three. Color balance can be adjusted by changing the sensor area in the vertical improved photo-detector cells.

A modulation transfer function (MTF) is a function that describes how sinusoidal patterns propagate through the imaging system. Generally, images with higher MTF and less noise are generally observed as having higher image quality. Increasing the sensor area in the improved vertical photo-detector cell reduces the MTF associated with the image sensor using. The effect of the reduced MTF is a spatial low-pass filter characteristic on the color images (e.g., red, blue, green), resulting in reduced color aliasing when high spatial frequencies are present in the image. The image quality is improved since the color artifacts due to aliasing are prevented by the optical low-pass filter characteristic in the imaging sensor.

The above specification, examples and data provide a complete description of the manufacture and use of the composition of the invention. Since many embodiments of the invention can be made without departing from the spirit and scope of the invention, the invention resides in the claims hereinafter appended.

I claim:

1. A pixel cell for an imaging sensor, comprising:
 a first improved vertical photo-detector cell that is located about a first location in the imaging sensor;
 a second improved vertical photo-detector cell that is located about a second location in the imaging sensor, wherein the second location is adjacent to the first location;
 a first photo-detector region that is located in the first and second improved vertical photo-detector cells, wherein the first photo-detector region is arranged to detect light that substantially corresponds to a first color, and the first photo-detector region has a first geometric center at the first location; and
 a second photo-detector region that is located in the second improved vertical photo-detector cells, wherein the second photo-detector region is arranged to detect light that substantially corresponds to a second color, and the second photo-detector region has a second geometric center at the second location.

2. The pixel cell as in claim 1, wherein the first color corresponds to one of red, green, and blue, and wherein the second color corresponds to another of red, green, and blue.

3. The pixel cell as in claim 1, wherein the first photo-detector region is located in a first plane and the second photo-detector region is located in a second plane that is different from the first plane.

4. The pixel cell as in claim 1, wherein the first photo-detector region is non-intersecting with respect to the second photo-detector region.

5. The pixel cell as in claim 3, wherein the first plane is located above the second plane such that the first photo-detector region is closer to a surface of the imaging sensor, and the first photo-detector region is arranged to supply a signal via an electrical contact that extends from the first photo-detector region to the surface of the imaging sensor.

6. The pixel cell as in claim 3, wherein the first plane is located below the second plane such that the second photo-detector region is closer to a surface of the imaging sensor, and the first photo-detector region is arranged to supply a signal via an electrical contact that extends from the first photo-detector region to the surface of the imagine sensor without contacting the second photo-detector region.

7. The pixel cell as in claim 1, further comprising: a third improved vertical photo-detector cell that is located at a third location in the imaging sensor, wherein the third location is adjacent to the first and second locations; and a third photo-detector region that is located in the third improved vertical photo-detector cell, wherein the third photo-detector region is arranged to detect light that substantially corresponds to a third color, and the third photo-detector region has a third geometric center at the third location.

8. A pixel cell for an imaging sensor, comprising:
 a first improved vertical photo-detector cell that is located about a first location in the imaging sensor;
 a second improved vertical photo-detector cell that is located about a second location in the imaging sensor, wherein the second location is adjacent to the first location;
 a first photo-detector region that is located in the first and second improved vertical photo-detector cells, wherein the first photo-detector region is arranged to detect light that substantially corresponds to a first color, and the first photo-detector region has a first geometric center at the first location;
 a second photo-detector region that is located in the second improved vertical photo-detector cells, wherein the second photo-detector region is arranged to detect light that substantially corresponds to a second color, and the second photo-detector region has a second geometric center at the second location;
 a third improved vertical photo-detector cell that is located at a third location in the imaging sensor, wherein the third location is adjacent to the first and second locations; and a third photo-detector region that is located in the third improved vertical photo-detector cell, wherein the third photo-detector region is arranged to detect light that substantially corresponds to a third color, and the third photo-detector region has a third geometric center at the third location;

a fourth improved vertical photo-detector cell that is located at a fourth location in the imaging sensor, wherein the fourth location is adjacent to the first, second, and third locations; and a fourth photo-detector region that is located in the fourth improved vertical photo-detector cell, wherein the third photo-detector region is arranged to detect light that substantially corresponds to the third color, and the fourth photo-detector region has a fourth geometric center at the fourth location.

9. The pixel cell as in claim 8, wherein the first, second, and third colors correspond to red, blue, and green, respectively.

10. The pixel cell as in claim 8, wherein the first, second, third, and fourth improved vertical photo-detector cells are arranged as a group that defines a sensor cell.

11. An imaging sensor that is arranged as an array of pixel cells, comprising:

a first sensor that is sensitive to light that approximately corresponds a first wavelength, wherein the first sensor is centered about a first pixel location in the array;

a second sensor that is sensitive to light that approximately corresponds a second wavelength, wherein the second sensor is centered about a second pixel location in the array;

a third sensor that is sensitive to light that approximately corresponds a third wavelength, wherein the third sensor is centered about a third pixel location in the array;

a fourth sensor that is sensitive to light that approximately corresponds the third wavelength, wherein the fourth sensor is centered about a fourth pixel location in the array;

a sensor material that is associated with a selected one of the first, second, third, and fourth sensors, wherein the sensor material includes a central portion and an extending portion, wherein the central portion is located within an improved vertical photo-detector cell, and the extending portion is located within another improved vertical photo-detector cell that is adjacent to the improved photo-detector cell, wherein the central portion is coupled to the extending portion such that photo-carriers are collected from the adjacent improved vertical photo-detector cell to increase sensitivity of the selected sensor.

12. The imaging sensor of claim 11, wherein the array of pixel cells includes a first alternating pattern of first and third sensors extending from a pixel cell along a first direction, a second alternating pattern of first and fourth sensors extending from the pixel cell along a second direction, a third alternating pattern of second and third sensors extending from the pixel cell along the first direction, and a fourth alternating pattern of second and fourth sensors extending from the pixel cell along the second direction.

13. The imaging sensor of claim 11, wherein the selected one of the sensors is configured in a shaped pattern that is defined by the central and extending portions of the sensor material, and wherein the shaped pattern corresponds to a quadrilateral that is substantially centered about a pixel in the array.

14. The imaging sensor of claim 13, wherein the selected one of the sensors is configured in a shaped pattern that is defined by the central and extending portions of the sensor material, and wherein the shaped pattern corresponds to a quadrilateral that is substantially centered about a pixel in the array such that the sensor material associated with selected one of the sensors has an effective area that is substantially twice the area associated with a pixel in the array.

15. The imaging sensor of claim 11, wherein the selected one of the sensors is configured in a shaped pattern that is defined by the central and extending portions of the sensor material, and wherein the shaped pattern corresponds to a quadrilateral that is oriented at angle of forty-five degrees about a pixel in the array.

16. The imaging sensor of claim 11, wherein the array of pixels includes a group of first sensors that are each arranged in a shaped pattern that corresponds to a quadrilateral that is oriented at angle of forty-five degrees about a respective pixel in the array such that the sensor has a fill-factor of approximately 100% for a color associated with the first wavelength.

17. The imaging sensor of claim 11, wherein the selected one of the sensors is configured in a shaped pattern that is defined by the central and extending portions of the sensor material, and wherein the extending portions of the sensor material extend along an orthogonal set of axis with respect to the center of sensor material.

18. The imaging sensor of claim 11, wherein the selected one of the sensors is configured in a shaped pattern that is defined by the central and extending portions of the sensor material, and wherein the extending portions of the sensor material extend along an orthogonal set of axis with respect to the center of sensor material such that the sensor material associated with selected one of the sensors has an effective area that is substantially three times the area associated with a pixel in the array.

19. The imaging sensor of claim 11, wherein the array of pixels includes a group of second sensors that are each arranged in a shaped pattern that is defined by the central and extending portions of the sensor material such that the extending portions of the sensor material extend along an orthogonal set of axis with respect to the center of sensor material, wherein the group of second sensors outline a central region that includes a fifth sensor that is sensitive to light that approximately corresponds the second wavelength, wherein the fifth sensor is configured to drain photo-carriers that are induced by second wavelength related light that is incident on the central region.

20. An imaging sensor, comprising:

a first means for collecting photo-carriers that is configured to collect first photo-carriers from a first improved vertical photo-detector cell, wherein the first photo-carriers are associated with a first color, a second means for collecting photo-carriers that is configured to collect second photo-carriers from a second improved vertical photo-detector cell that is located adjacent the first improved vertical photo-detector cell, wherein the second photo-carriers are associated with a second color;

a third means for collecting photo-carriers that is configured to collect first photo-carriers from the second improved photo-detector cell;

a means for coupling that is configured to couple the first photo-carriers that are collected from the second means for collecting photo-carriers to the first photo-carriers that are collected from the first means for collecting photo-carriers such that photo-carriers that are associated with the first color from the improved vertical photo-detector cell and the adjacent improved vertical photo-detector are combined to increase sensitivity to the first color in the sensor.

* * * * *

UNITED STATES PATENT AND TRADEMARK OFFICE
CERTIFICATE OF CORRECTION

| | | |
|---|---|---|
| PATENT NO. | : 6,753,585 B1 | |
| APPLICATION NO. | : 10/313674 | |
| DATED | : June 22, 2004 | |
| INVENTOR(S) | : Kindt | |

It is certified that error appears in the above-identified patent and that said Letters Patent is hereby corrected as shown below:

Column 3, line 50, "of an improved photo-detector," should read -- of an improved vertical photo-detector, --.

Column 4, line 4, "more massive or active" should read -- more passive or active --.

Column 4, line 50, "light (I50)" should read -- light (150)--.

Column 7, line 27, "in FIGURE" should read -- in FIGURE 4--.

Signed and Sealed this

Twenty-fourth Day of April, 2007

JON W. DUDAS
*Director of the United States Patent and Trademark Office*